(12) United States Patent
Xu et al.

(10) Patent No.: US 10,157,910 B2
(45) Date of Patent: Dec. 18, 2018

(54) CIRCUITS AND STRUCTURES INCLUDING TAP CELLS AND FABRICATION METHODS THEREOF

(71) Applicant: Taiwan Semiconductor Manufacturing Company Limited, Hsinchu (TW)

(72) Inventors: Jin-Wei Xu, Hsinchu (TW); Ting-Wei Chiang, New Taipei (TW); Hui-Zhong Zhuang, Kaohsiung (TW); Li-Chun Tien, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 9 days.

(21) Appl. No.: 15/284,678

(22) Filed: Oct. 4, 2016

(65) Prior Publication Data

US 2017/0194319 A1    Jul. 6, 2017

Related U.S. Application Data

(60) Provisional application No. 62/272,807, filed on Dec. 30, 2015.

(51) Int. Cl.
| | |
|---|---|
| *H01L 27/108* | (2006.01) |
| *H01L 27/06* | (2006.01) |
| *H01L 23/528* | (2006.01) |
| *H01L 49/02* | (2006.01) |
| *H01L 27/02* | (2006.01) |
| *H01L 21/8238* | (2006.01) |
| *H01L 27/092* | (2006.01) |

(52) U.S. Cl.
CPC ...... *H01L 27/0629* (2013.01); *H01L 23/5286* (2013.01); *H01L 27/0207* (2013.01); *H01L 28/00* (2013.01); *H01L 28/40* (2013.01); *H01L 21/823871* (2013.01); *H01L 27/092* (2013.01)

(58) Field of Classification Search
CPC ............. H01L 27/0629; H01L 27/0207; H01L 27/092; H01L 27/10805; H01L 27/10897; H01L 27/11898; H01L 27/0296; H01L 21/823871; H01L 23/5286; H01L 28/40; H01L 23/50; H01L 23/5222–23/5225
USPC .................................................. 257/296–300
See application file for complete search history.

(56) References Cited

U.S. PATENT DOCUMENTS

| | | | | |
|---|---|---|---|---|
| 8,896,087 B2* | 11/2014 | Terletzki | ............. | H01L 27/0207 257/516 |
| 2006/0291316 A1* | 12/2006 | Jenne | ..................... | G11C 17/16 365/225.7 |
| 2007/0045770 A1* | 3/2007 | Aoki | .................... | H01L 27/0207 257/516 |
| 2008/0001197 A1* | 1/2008 | Kawakatsu | ............. | H01L 27/11 257/296 |
| 2008/0173914 A1* | 7/2008 | Hashimoto | ......... | H01L 27/0207 257/296 |

(Continued)

*Primary Examiner* — Kevin M Picardat
(74) *Attorney, Agent, or Firm* — Jones Day

(57) ABSTRACT

An example circuit includes: one or more power rails and a tap cell structure. The tap cell structure includes one or more decoupling capacitor cells and one or more tap cells. The one or more tap cells are electrically coupled to the one or more power rails. The one or more decoupling capacitor cells are disposed adjacent to the tap cells and electrically coupled to the one or more power rails.

20 Claims, 10 Drawing Sheets

(56) References Cited

U.S. PATENT DOCUMENTS

| | | | | |
|---|---|---|---|---|
| 2011/0198677 A1* | 8/2011 | Carlson | ............... | H01L 27/0805 |
| | | | | 257/296 |
| 2012/0286331 A1* | 11/2012 | Aton | ................... | H01L 27/0207 |
| | | | | 257/202 |
| 2012/0286341 A1* | 11/2012 | Chen | ................... | H01L 27/0805 |
| | | | | 257/296 |

* cited by examiner

CIRCUITS AND STRUCTURES INCLUDING TAP CELLS AND FABRICATION METHODS THEREOF

CROSS-REFERENCE TO RELATED APPLICATIONS

This application claims priority to U.S. Provisional Patent Application No. 62/272,807, filed Dec. 30, 2015, entitled "Circuits and Structures Including Tap Cells and Fabrication Methods Thereof," which is incorporated herein by reference in its entirety.

BACKGROUND

The technology described in this disclosure relates generally to integrated circuits and more particularly to integrated circuit design.

An integrated circuit often includes various cells, including tap cells (or spacer cells). For example, tap cells can provide a body bias of transistors and also can prevent undesirable latch-up (e.g., a type of short circuit) of an integrated circuit which results from parasitic bipolar transistors formed by adjacent junctions in the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
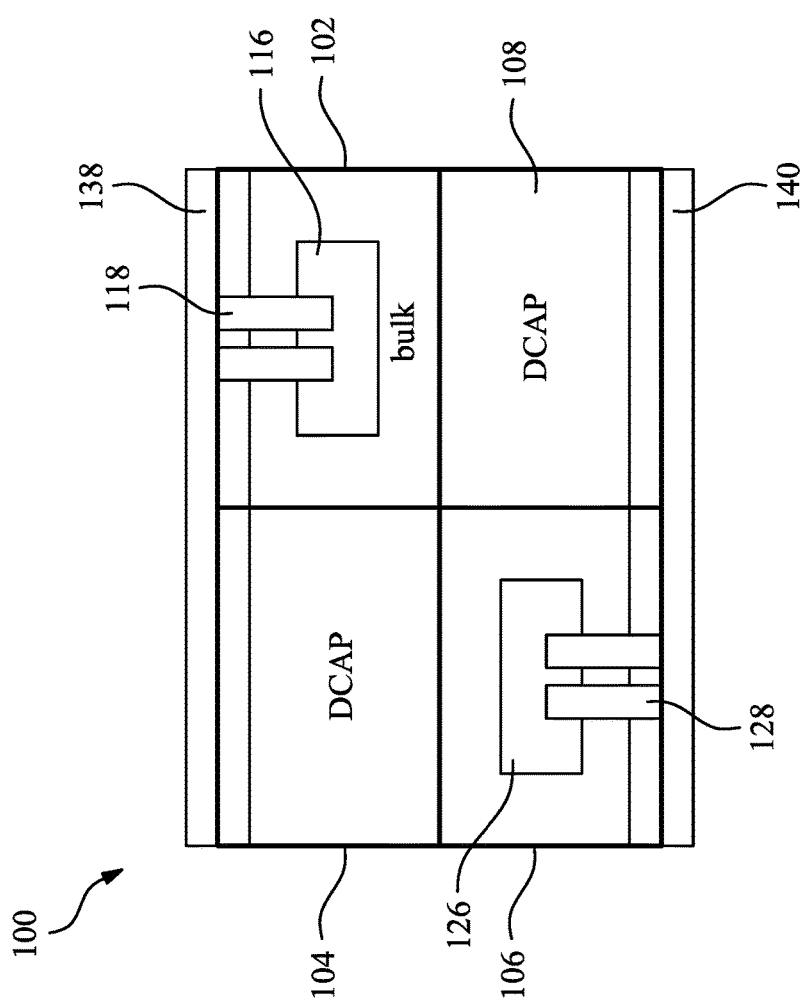
FIG. 1 depicts an example diagram showing a tap cell structure with DCAP cells, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "in," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a cell refers to a group of one or more circuit elements such as transistors, capacitors, resistors, inductors, and other basic circuit elements combined to perform certain functions. As described herein, a tap cell structure includes one or more tap cells (sometimes referred to as bulk cells).

A tap cell includes a well tap and a substrate tap that are located appropriate distances from one another to prevent latch-up, in some embodiments. A well tap is an electrically conductive lead that couples a well region to a power source. For example, the well region includes a heavily doped n-region in an n-type well on a p-type substrate. The heavily doped n-region is coupled through the well tap to a VDD power rail which corresponds to the power source, and thus sets the potential of the n-type well to prevent leakage from adjacent source/drain regions into the well. A substrate tap is an electrically conductive lead that couples a substrate region to an electrical ground. For example, the substrate region includes a heavily doped p-region which is formed in a p-type substrate. The heavily doped p-region is coupled through the substrate tap to a VSS power rail which corresponds to the electrical ground, and thus sets the potential of the substrate to prevent leakage from adjacent source/drain regions. Through the usage of tap cells, the substrate resistance and undesirable positive feedback in the integrated circuit is reduced.

In an example, the well taps and the substrate taps of the tap cells in a tap cell structure are positioned so that the distance between any two well taps and any two substrate taps does not exceed a maximum allowable distance that is obtained using a predetermined set of design rules associated with the integrated circuit.

In some embodiments, design rule specify that the distance from any point in either the substrate or well regions should not be farther than a maximum distance from the nearest substrate tap or well tap, respectively. Further, in examples, the design rules specify various other physical parameters for the proper construction of the integrated circuit such as a minimum allowable distance between wires or conducting paths disposed in the integrated circuit and a minimum allowable width of such wires.

One problem that has arisen in modern electronic devices relates to noise in the power grid of devices. Substantial noise is generated in an integrated circuit chip as digital electronic functions are interconnected or decoupled, in examples. The power grid provides the power and ground signals throughout the chip. Supply voltage variations can lead not only to problems related to spurious transitions in some cases (particularly when dynamic logic is used), but also to delay variations and timing unpredictability. Even if a reliable supply is provided at an input pin of a chip, it can deteriorate significantly within the chip due to imperfections in the conductors that transmit these signals throughout the chip.

One solution to this problem lies in the use of decoupling capacitors (DCAP). On-chip DCAPs attached to the power grid can reduce power supply induced noise. The present disclosure includes embodiments in which DCAP cells are inserted into tap cell structures (e.g., for process uniformity, device performance improvement, and chip area efficiency).

FIG. 1 depicts an example diagram showing a tap cell structure with DCAP cells, in accordance with some embodiments. As shown in FIG. 1, a tap cell structure 100 corresponds to a predetermined chip area and includes tap cells 102 and 106 which are placed diagonally from each other. According to certain design rules, the rest of the predetermined chip area cannot be used for tap cells. Instead of filler cells which do not contain any passive or active circuit structures, DCAP cells 104 and 108 are inserted into the tap cell structure 100 to fill in the rest of the chip area which is not occupied by the tap cells 102 and 106.

The tap cell 102 includes an active region 116 (e.g., including a gate oxide and a diffusion region) and one or more conductors 118 which connect the active region 116 to a power rail 138 (e.g., VDD). The tap cell 106 includes an active region 126 (e.g., including a gate oxide and a diffusion region) and one or more conductors 128 which connect the active region 126 to a power rail 140 (e.g., VSS). The tap cells 102 and 106 are placed adjacent to the DCAP cells 104 and 108 along one or more directions (e.g., horizontally and/or vertically). For example, the tap cell 102 is placed on top of the DCAP cell 108 and to the right of the DCAP cell 104, and the tap cell 106 is placed below the DCAP cell 104 and to the left of the DCAP cell 108. It should be understood that the circuit designs and/or the mechanisms described herein are not limited to any specific geometries, locations and/or directions.

Figure 2A:
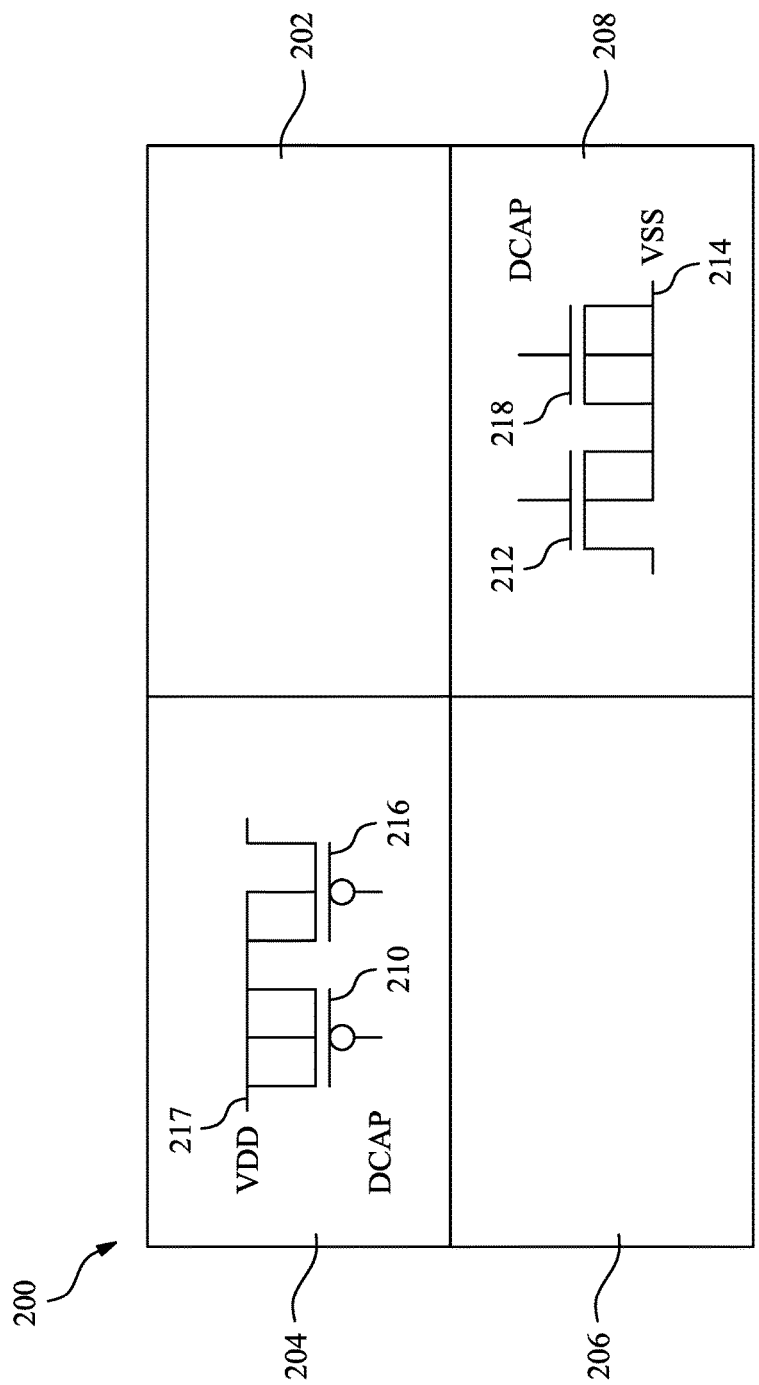
FIG. 2A depicts an example schematic circuit diagram of a tap cell structure, in accordance with some embodiments.
Figure 2B:
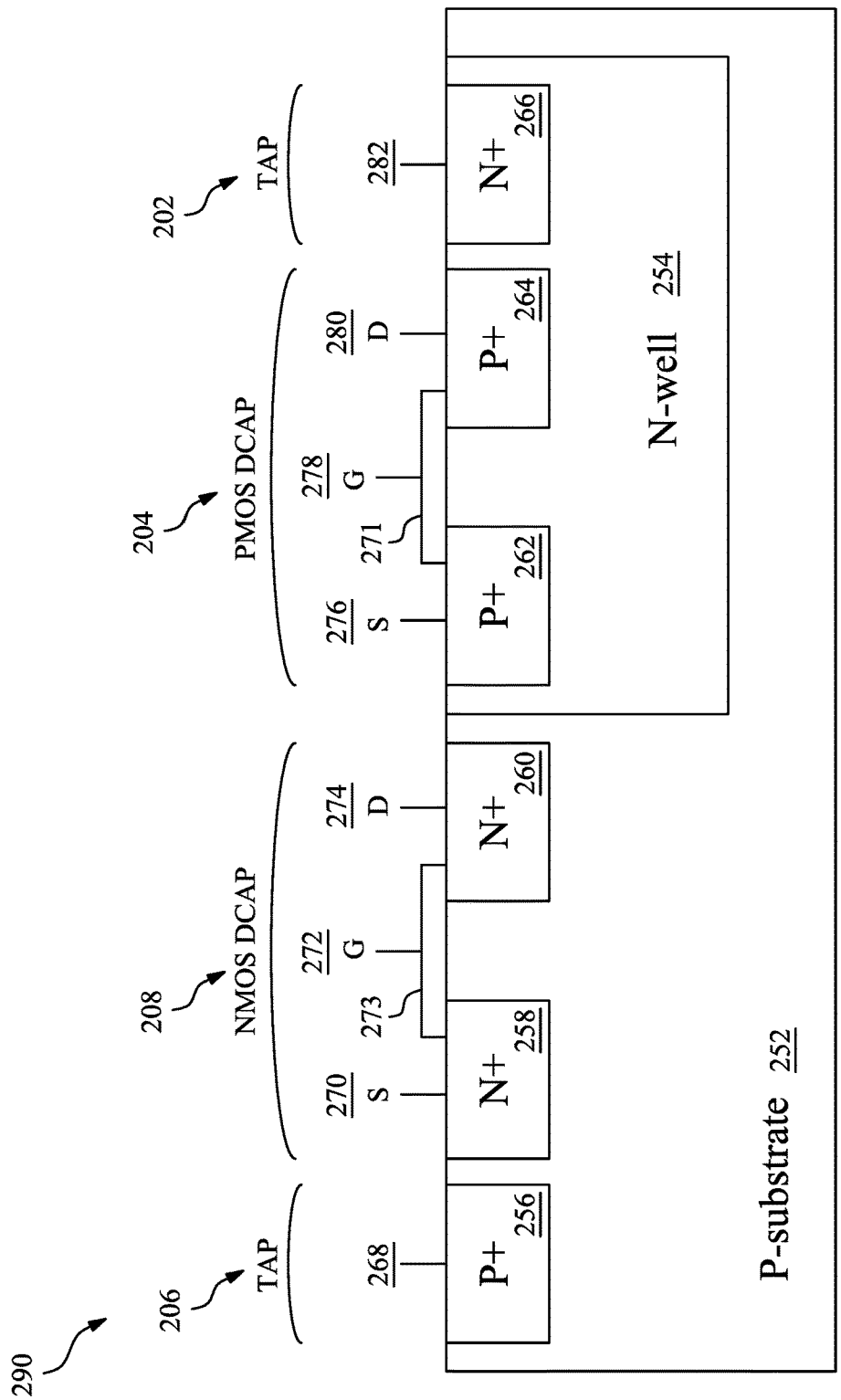
FIG. 2B depicts a profile view of an example tap cell structure, in accordance with some embodiments.
Figure 2C:
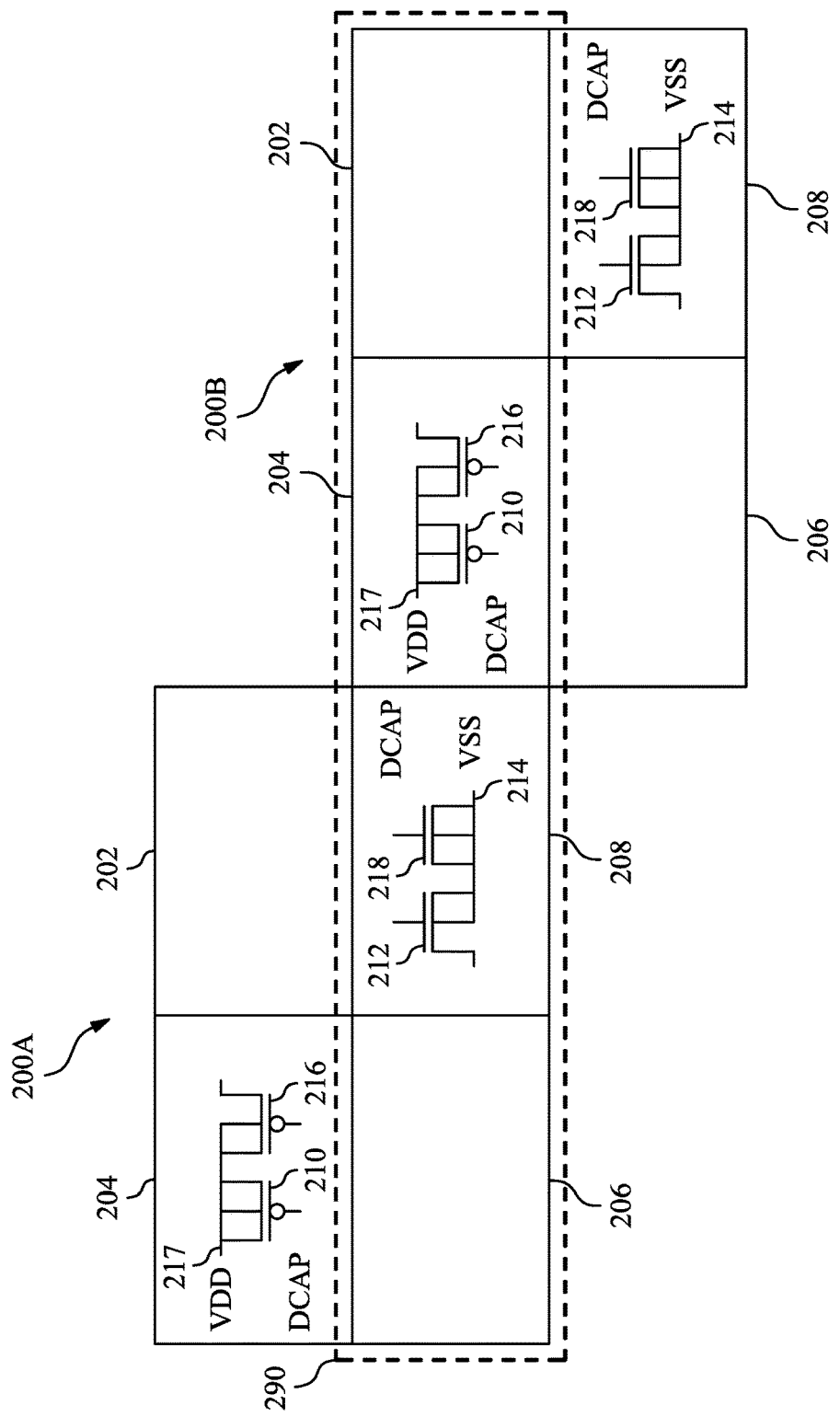
FIG. 2C depicts two tap cell structures placed side-by-side, in accordance with some embodiments.

As an example, the DCAP cells 104 and 108 are placed diagonally from each other. In some embodiments, the tap cell structure 100 does not include any filler cells. A "filler cell," as referred to herein, is a cell that may contain a well and power and ground conductors but does not have any passive or active circuit structures. Compared to the DCAP cells 104 and 108, filler cells do not play any significant role in the operation of the integrated circuit since the filler cells do not contain any passive or active circuit structures. In contrast, the DCAP cells 104, 108 work to reduce noise (e.g., power supply induced noise) in the integrated circuit, in some embodiments. In some examples, the DCAP cells 104, 108 include capacitors or components (e.g., transistors) that function as capacitors. FIGS. 2A, 2B, and 2C, described below, provide examples of how transistors are configured as capacitors. Such capacitors or components functioning as capacitors are coupled between a power supply of the integrated circuit and electrical ground, in examples. Noise caused by elements of the integrated circuit, such as the power supply, is shunted through the capacitors of the DCAP cells 104, 108, thus reducing the effect of the noise on other portions of the integrated circuit, in some embodiments. For example, when switching occurs in circuit elements of the integrated circuit, current demands in these circuit elements change. Such variations in current demand result in fluctuations (e.g., voltage ripples) in the power supply voltage provided by the power supply. The fluctuations in the power supply voltage, which may have a relatively high frequency, comprise noise that can be harmful to the integrated circuit. The capacitors (or components functioning as capacitors) of the DCAP cells 104, 108 suppress this noise by removing or lessening the voltage fluctuations of the power supply voltage. In accomplishing this, the capacitors of the DCAP cells 104, 108 temporarily function as local power supplies for the integrated circuit, in some embodiments. For example, when the fluctuations in the power supply voltage cause the power supply voltage to drop, the capacitors of the DCAP cells 104, 108 briefly supply power at the correct voltage. Such capacitors may be referred to as "bypass capacitors" because they temporarily act as a power source and bypass the power supply.

In addition, the DCAP cells 104 and 108 are inserted into the chip area predetermined for the tap cell structure 100 instead of occupying additional chip areas. Thus, the overall chip area efficiency can be improved.

FIG. 2A depicts an example schematic circuit diagram of a tap cell structure, in accordance with some embodiments. As shown in FIG. 2A, two tap cells 202 and 206 are placed diagonally from each other in a tap cell structure 200, and two DCAP cells 204 and 208 are placed diagonally from each other in the tap cell structure 200. In some embodiments, the DCAP cell 204 includes one or more p-type transistors (e.g., PMOS transistors 210 and 216). In addition, the DCAP cell 208 includes one or more n-type transistors (e.g., NMOS transistors 212 and 218). Thus, the tap cell structure of FIG. 2A includes one DCAP cell with p-type transistors and another DCAP cell with n-type transistors. In some embodiments, the substrates (or bodies) of the p-type transistors in the DCAP cell 204 are coupled to a power rail 217 (e.g., VDD), and the substrates (or bodies) of the n-type transistors in the DCAP cell 208 are coupled to a power rail 214 (e.g., VSS). In some embodiments, gate terminals of the p-type transistors in the DCAP cell 204 are coupled to the power rail 214, and gate terminals of the n-type transistors in the DCAP cell 208 are coupled to the power rail 217. In some embodiments, source and drain terminals of the p-type transistors in the DCAP cell 204 are coupled to the power rail 217, and source and drain terminals of the n-type transistors of the DCAP cell 208 are coupled to the power rail 214.

To further illustrate this example tap cell structure, reference is made to FIG. 2B. This figure provides an example profile view 290 of the tap cell structure of FIG. 2A. The profile view 290 shown in FIG. 2B is a result of placing two of the tap cell structures 200 of FIG. 2A side-by-side, in some embodiments. This is shown, for example, in FIG. 2C, which shows tap cell structures 200A and 200B placed side-by-side to yield the example profile view 290 shown in FIG. 2B. As shown in FIG. 2B, the structure is formed on a p-type substrate 252, in some embodiments. The tap cell 206 functions as a substrate tap and includes a heavily doped p-type (e.g., P+) region 256 formed in the p-type substrate 252. The tap cell 206 further includes an electrically conductive lead 268, which includes or is formed on an electrode disposed over the heavily doped p-type region 256. In examples, the electrically conductive lead 268 couples the heavily doped p-type region 256 to the VSS power rail 214 that corresponds to the electrical ground and thus sets the potential of the substrate 252 to prevent leakage from adjacent source/drain regions.

In FIG. 2B, the tap cell 202 functions as a well tap and includes a heavily doped n-type (e.g., N+) region 266 formed in an n-type well 254. The tap cell 202 further includes an electrically conductive lead 282, which includes or is formed on an electrode disposed over the heavily doped n-type region 266. In examples, the electrically conductive lead 282 couples the heavily doped n-type region 266 to the VDD power rail 217 and thus sets the potential of the n-type well 254 to prevent leakage from adjacent source/drain regions into the well. In FIG. 2B, the tap cell 206 (e.g., the substrate tap) and the tap cell 202 (e.g., the well tap) are located an appropriate distance away from each other and are electrically isolated from each other to prevent latch-up (e.g., a type of short circuit). In the example of FIG. 2B, the tap cells 202, 206 are separated by the DCAP cells 204, 208. As described above with reference to FIG. 2A, the DCAP cell 204 includes one or more p-type transistors, and the DCAP cell 208 includes one or more n-type transistors, in some embodiments. Such p- and n-type transistors of the respective DCAP cells 204, 208 operate as capacitors, in examples. Specifically, in some embodiments, in the DCAP cell 204, capacitors are formed between (i) P+ region 262 and gate 271, (ii) P+ region 264 and the gate 271, and (iii) the gate 271 and a channel formed in the n-type well 254 below the gate 271. Likewise, in some embodiments, in the DCAP cell 208, capacitors are formed between (i) N+ region 258 and gate 273, (ii) N+ region 260 and the gate 273, and (iii) the gate 273 and a channel formed in the p-type substrate 252 below the gate 272.

As shown in FIG. 2B, to form a p-type transistor of the DCAP cell 204, heavily doped p-type (P+) regions 262, 264 are formed in the n-type well 254. These heavily doped p-type regions 262, 264 comprise respective source and drain regions of the p-type transistor, such that a source electrode 276 is disposed on the region 262, and a drain electrode 280 is disposed on the region 264. The gate terminal 278 (e.g., comprising one or more of a conductive material, such as polysilicon, and a gate oxide) of the p-type transistor is coupled to the VSS power rail 214 (e.g., electrical ground), in examples. The n-type well 254 (e.g., the "body" of the p-type transistor), is coupled to the VDD power rail 217, in examples. The heavily doped p-type regions 262, 264 are coupled to the VDD power rail 217, in examples.

To form an n-type transistor of the DCAP cell 208, heavily doped n-type (N+) regions 258, 260 are formed in the p-type substrate 252. These heavily doped n-type regions 258, 260 comprise respective source and drain regions of the n-type transistor, such that a source electrode 270 is disposed on the region 258, and a drain electrode 274 is disposed on the region 260. A gate terminal 272 (e.g., comprising one or more of a conductive material, such as polysilicon, and a gate oxide) of the n-type transistor is coupled to the VDD power rail 217, in examples. The p-type substrate 252 (e.g., the "body" of the n-type transistor), is coupled to the VSS power rail 214, in examples. The heavily doped n-type regions 258, 260 are coupled to the VSS power rail 214, in examples.

As noted above, the p- and n-type transistors of the respective DCAP cells 204, 208 operate as capacitors, in examples. With the example electrical connections described above (e.g., where the tap cell 202, gate terminal 272, and n-type well 254 are connected to the VDD power rail 217, and the tap cell 206, gate terminal 278, and p-type substrate 252 are connected to the VSS power rail 214), the DCAP cells 204, 208 work to reduce power supply induced noise in an integrated circuit in which they are included, in some embodiments. Noise caused by the power supply is shunted through the p- and n-type transistors of the respective DCAP cells 204, 208, thus reducing the effect of the noise on other portions of the integrated circuit, in some embodiments. For example, the p- and n-type transistors of the respective DCAP cells 204, 208, functioning as capacitors, remove or lessen voltage fluctuations of the VDD power rail 217. In accomplishing this, the transistors of the DCAP cells 204, 208 briefly supply power at a correct voltage when the fluctuations in the VDD power line 217 cause the power supply voltage to drop, in some embodiments.

It is noted that the tap cell structure of FIGS. 2A and 2B is only an example. For example, although FIG. 2B depicts the p-type substrate 252, n-type well 254, and regions 256-264 suitably doped N+ or P+ depending on whether they are formed in the substrate 252 or the well 254, the tap cell structure varies in other examples. For instance, a similar tap cell structure can be formed using an n-type substrate, a p-type well, and regions that are suitably doped N+ or P+ depending on whether they are formed in the n-type substrate or the p-type well. Additionally, in one embodiment, the DCAP cells 204 and 208 both include n-type transistors. In another embodiment, the DCAP cells 204 and 208 both include p-type transistors. In each of these embodiments, the transistors of the DCAP cells 204, 208 function as capacitors to reduce power supply noise in the manner described above.

Fabrication of the tap cell structures described herein is achieved using CMOS manufacturing techniques, in some embodiments. An example fabrication process is described with reference to FIG. 2B. To begin the example fabrication process, a bulk p-type substrate 252 is provided. The bulk p-type substrate 252 comprises a conventional Silicon wafer that has been doped with suitable impurities to form a lightly or moderately doped p-type wafer, in some embodiments. Next, a process is performed to form the n-type well 254 in the p-type substrate 252. The formation of well regions is known to those of ordinary skill in the art and includes, in some embodiments, (i) forming a suitable mask (e.g., a hard mask, a soft mask, a mask including silicon dioxide, etc.) over the p-type substrate 252, the mask including an opening over an area of the substrate 252 in which the well 254 is to be formed, and (ii) implanting or diffusing n-type dopants (e.g., Arsenic, etc.) into the area or areas of the substrate 252 that are left exposed by the mask. The n-type dopants are implanted or diffused in a manner that causes the n-type well 254 to be moderately doped or lightly doped n-type.

After forming the n-type well 254, the mask used to form the well 254 is removed (e.g., stripped). Next, in some embodiments, a thin gate oxide layer (e.g., having a thickness of 2-10 nm, etc.) is formed on a surface of the substrate 252. Subsequently, a polysilicon or other conductive layer is formed over the thin gate oxide layer. The polysilicon layer is formed via a Chemical Vapor Deposition (CVD) process, in examples. The polysilicon and gate oxide layers are patterned to form the gate structures illustrated in FIG. 2B. Such patterning is accomplished using standard lithography processes known to those of ordinary skill in the art. In some embodiments, the gate structures serve as masks to allow precise alignment of the transistors' source and drain regions with the gate.

Next, a process is performed to form the heavily doped n-type (e.g., N+) regions 258, 260, 266. The formation of heavily doped n-type regions is known to those of ordinary skill in the art and includes, in some embodiments, (i) forming an oxide layer (or another suitable masking layer) over the surface of the wafer 252, including the gate structures, (ii) patterning the oxide layer to form a suitable mask over the wafer 252, the mask including multiple openings over areas of the substrate 252 in which the regions 258, 260, 266 are to be formed, and (iii) implanting or diffusing n-type dopants into the areas of the substrate 252 that are left exposed by the mask. The n-type dopants are implanted or diffused in a manner that causes the regions 258, 260, 266 to be heavily doped n-type. This is in contrast to the lighter n-type doping used for the well 254.

After forming the heavily doped n-type regions 258, 260, 266, the mask used in forming these regions is removed, and a process is performed to form the heavily doped p-type (e.g., P+) regions 256, 262, 264. The formation of heavily doped p-type regions is known to those of ordinary skill in the art and includes, in some embodiments, (i) forming an oxide layer (or other suitable masking layer) over the surface of the wafer 252, (ii) forming a suitable mask over the wafer 252, the mask including multiple openings over areas of the substrate 252 in which the regions 256, 262, 264 are to be formed, and (ii) implanting or diffusing p-type dopants (e.g., Boron) into the areas of the substrate 252 that are left exposed by the mask. The p-type dopants are implanted or diffused in a manner that causes the regions 256, 262, 264 to be heavily doped p-type. The mask used in forming the heavily doped p-type regions 256, 262, 264 is then removed. Next, metallization processes are used to form the contacts or electrodes for the terminals 268, 270, 272, 274, 276, 278, 280, 282. Electrical connections to these terminals are made in accordance with the connections described above. The forming of the electrical connections is known as design routing (e.g., wiring).

Figure 3:
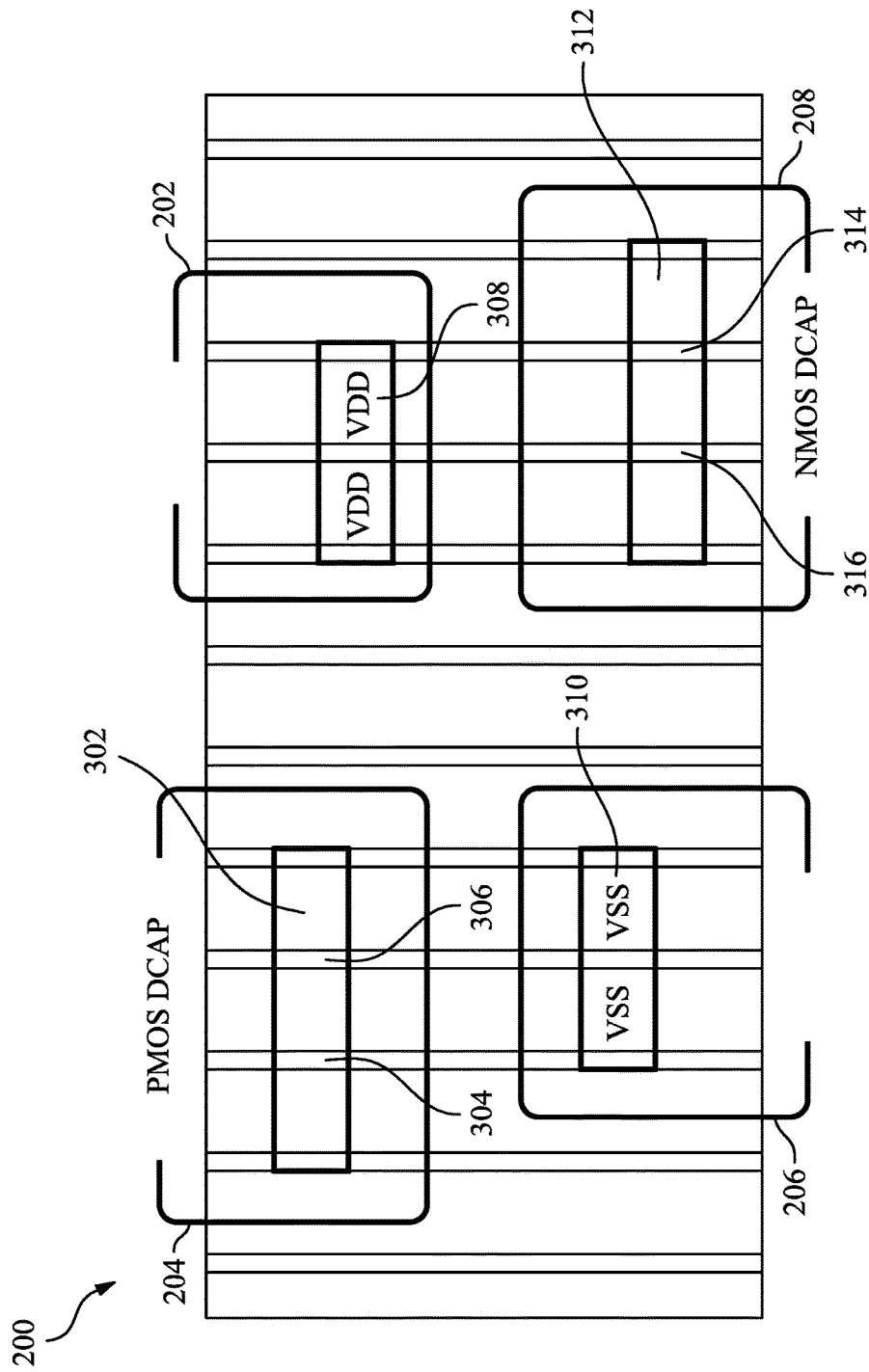
FIG. 3 depicts an example diagram showing a partial layout of the tap cell structure as shown in FIG. 2A, in accordance with some embodiments.

FIG. 3 depicts an example diagram showing a partial layout of the tap cell structure 200, in accordance with some embodiments. As shown in FIG. 3, an active region 302 (e.g., including a gate oxide and a diffusion region) is provided for the DCAP cell 204, and one or more gate structures are disposed on the active region 302. For example, the gate structures 304 and 306 include conductive materials (e.g., poly-silicon) and correspond to the gate terminals of the PMOS transistors 210 and 216, respectively. The gate structures 304 and 306 extend into the tap cell 206 which includes an active region 310 (e.g., including a gate oxide and a diffusion region). In some embodiments, the active region 310 is biased to a low-voltage power rail (e.g., VSS).

In addition, an active region 312 (e.g., including a gate oxide and a diffusion region) is provided for the DCAP cell 208, and one or more gate structures are disposed on the active region 312. For example, the gate structures 316 and 314 include conductive materials (e.g., poly-silicon) and correspond to the gate terminals of the NMOS transistors 212 and 218, respectively. The gate structures 316 and 314 extend into the tap cell 202 which includes an active region 308. In some embodiments, the active region 308 is biased to a high-voltage power rail (e.g., VDD).

Figure 4:
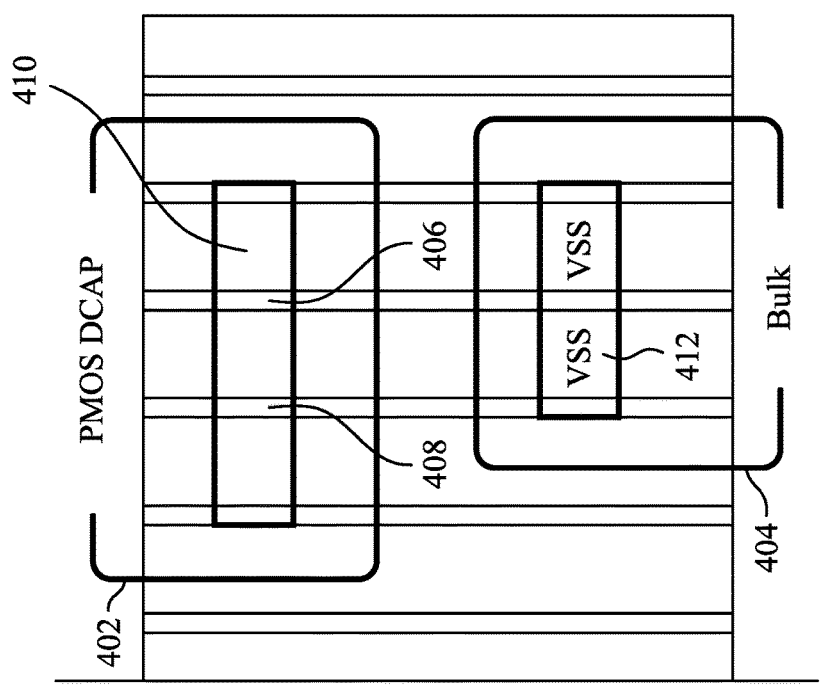
FIG. 4 depicts an example diagram showing a tap cell structure including a DCAP cell and a tap cell, in accordance with some embodiments.

In some embodiments, a chip including diagonally disposed DCAP cells and tap cells (e.g., as shown in FIG. 3) is divided into multiple pieces, each including only one DCAP cell and one tap cell. For example, as shown in FIG. 4, a chip piece includes a DCAP cell 402 which contains one or more p-type transistors and a tap cell 404. An active region 406 is provided for the DCAP cell 402, and gate structures 408 and 410 are disposed on the active region 406. For example, the gate structures 408 and 410 include conductive materials (e.g., poly-silicon) and correspond to gate terminals of the p-type transistors in the DCAP cell 402. The gate structures 408 and 410 extend into the tap cell 404 which includes an active region 412. For example, the active region 412 is biased to a low-voltage power rail (e.g., VSS).

In some embodiments, the DCAP cell 402 is the same as the DCAP cell 204, and the tap cell 404 is the same as the tap cell 206. The structure shown in FIG. 4 corresponds to the left half of the structure shown in FIG. 3.

Figure 5:
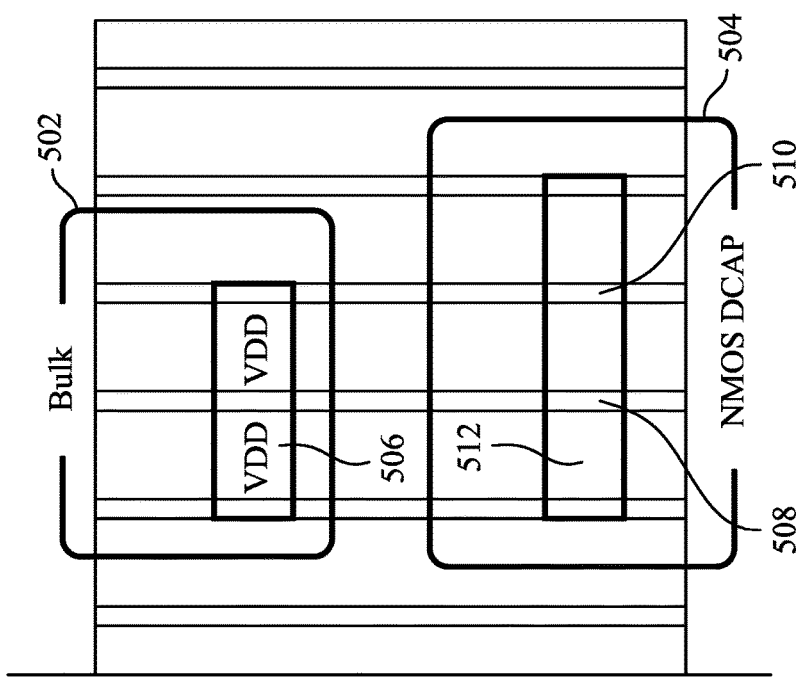
FIG. 5 depicts another example diagram showing a tap cell structure including a DCAP cell and a tap cell, in accordance with some embodiments.

As another example, as shown in FIG. 5, a chip piece includes a DCAP cell 504 which contains one or more n-type transistors and a tap cell 502. An active region 512 is provided for the DCAP cell 504, and gate structures 508 and 510 are disposed on the active region 512. For example, the gate structures 508 and 510 include conductive materials (e.g., poly-silicon) and correspond to gate terminals of the n-type transistors in the DCAP cell 504. The gate structures 508 and 510 extend into the tap cell 502 which includes an active region 506. For example, the active region 506 is biased to a high-voltage power rail (e.g., VDD).

In some embodiments, the DCAP cell 504 is the same as the DCAP cell 208, and the tap cell 502 is the same as the tap cell 202. The structure shown in FIG. 5 corresponds to the right half of the structure shown in FIG. 3.

Figure 6:
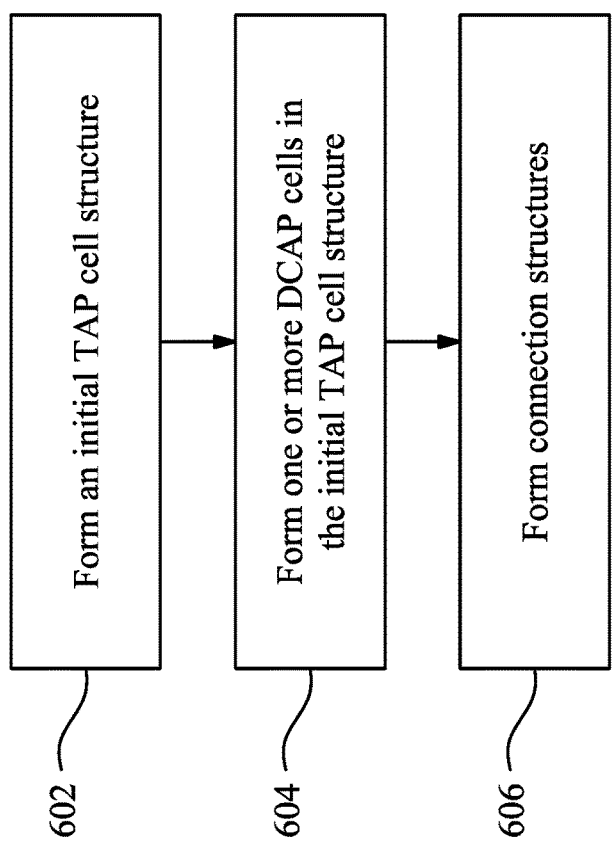
FIG. 6 depicts an example flow diagram for manufacturing a tap cell structure with DCAP cells, in accordance with some embodiments.

FIG. 6 depicts an example flow diagram for manufacturing a tap cell structure with DCAP cells, in accordance with some embodiments. At 602, an initial tap cell structure (e.g., the structure 100) is formed. For example, one or more tap cells (e.g., the tap cells 102 and 106) are formed in the initial tap cell structure. The initial tap cell structure corresponds to a predetermined chip area. At 604, one or more decoupling capacitor (DCAP) cells (e.g., the DCAP cells 104 and 108) are formed adjacent to the one or more tap cells within the predetermined chip area. At 606, one or more connection structures (e.g., the connections 118 and 128) are formed for electrically coupling the one or more decoupling capacitor cells to one or more power rails. For example, the DCAP cells are coupled directly with a VDD power rail or a VSS power rail through the one or more connection structures. As an example, the DCAP cells are coupled with a VDD power rail or a VSS power rail through the one or more tap cells.

Figure 7A:
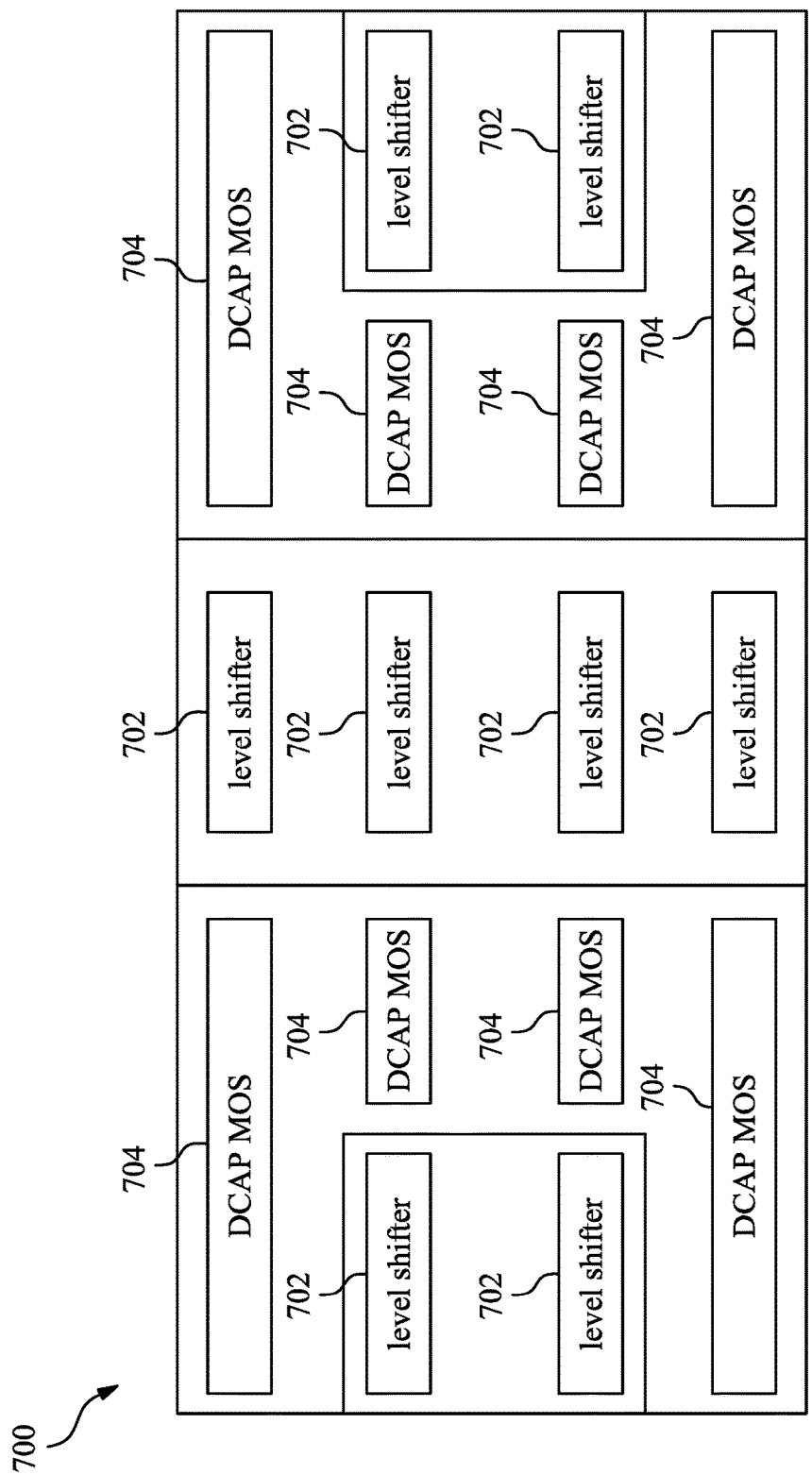
FIGS. 7A and 7B depict the use of DCAP cells in a layout including level shifter cells, in accordance with some embodiments.
Figure 7B:
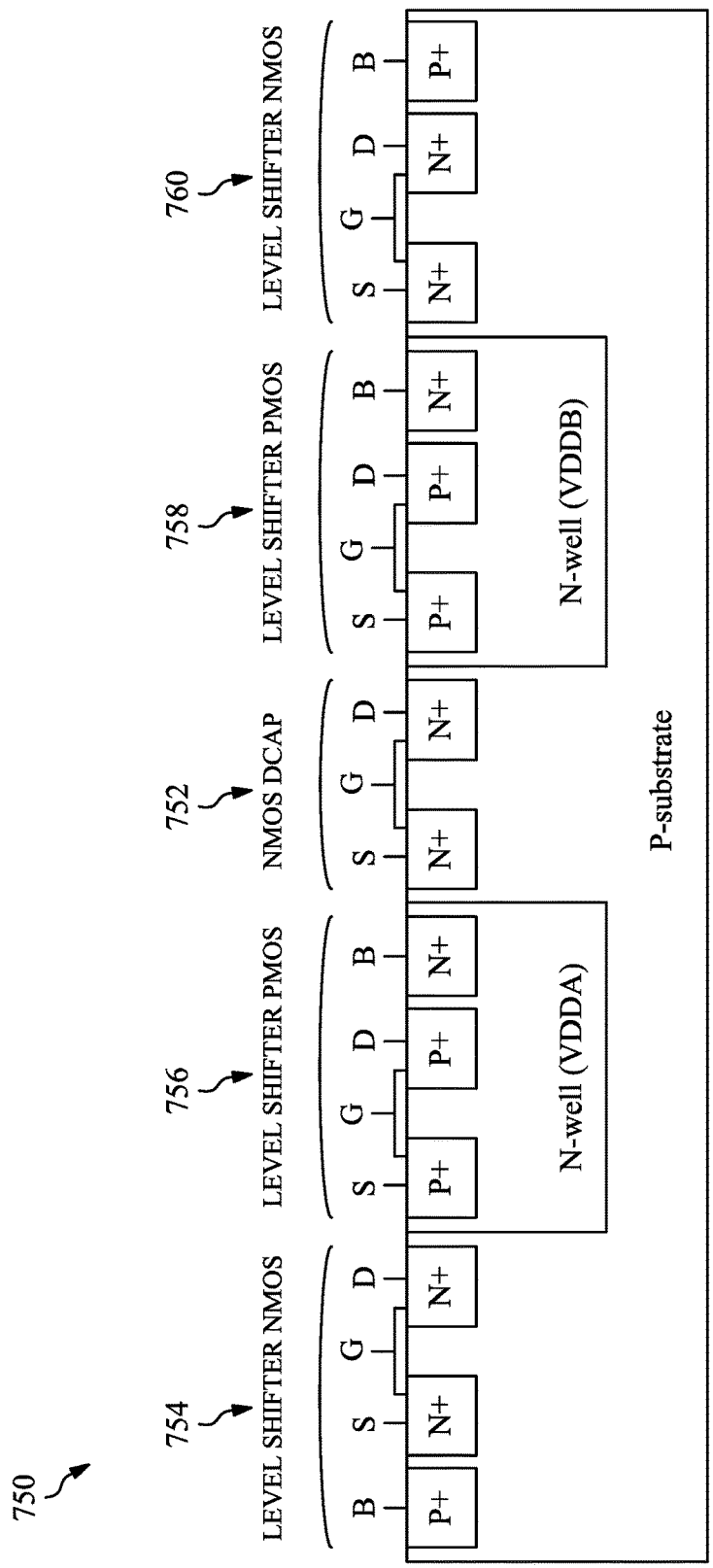

FIGS. 7A and 7B depict the use of DCAP cells in a layout including level shifter cells, in accordance with some embodiments. FIG. 7A specifically depicts a floor plan 700 including multiple level shifter cells 702 and multiple DCAP cells 704. FIG. 7B specifically depicts a profile view 750 with first level shifter cells 754, 756 separated from second level shifter cells 758, 760 by a DCAP cell 752. Level shifters, which may also be referred to as "voltage level shifters," are typically used to translate one voltage level to another. For example, digital voltage signals of one logic level (e.g., TTL level) are translated to another logic level (e.g., CMOS level) using a level shifter, in examples. In a circuit design layout, level shifters are typically separated from one another by an appropriate distance in order to prevent undesirable conditions that result from placing level shifters too close together (e.g., voltage breakdown conditions, leakage, etc.).

In conventional approaches, level shifters are separated from each other by filler cells that do not contain any passive or active circuit structures. Such filler cells provide the needed spatial separation between level shifters but otherwise do not play a role in the operation of the integrated circuit. In contrast to these conventional approaches, in the approaches of the instant disclosure, DCAP cells are placed between level shifters. The DCAP cells provide the needed spatial separation between level shifters and also work to reduce noise (e.g., power supply induced noise) in the integrated circuit. The use of DCAP cells (e.g., including capacitors or components configured to function as capacitors) to reduce noise in an integrated circuit is described above.

In FIG. 7A, DCAP cells 704 are used to provide spatial separation between level shifter cells 702. The floor plan 700 of FIG. 7A thus varies from conventional floor plans, which typically place filler cells between level shifter cells. As noted above, in addition to providing the spatial separation, the DCAP cells 704 also reduce the effect of noise in the integrated circuit, in examples. It is noted that the particular floor plan 700 depicted in FIG. 7A is only an example, and that in other examples, DCAP cells and level shifter cells are placed in other arrangements.

In FIG. 7B, a first NMOS-based level shifter 754 and a first PMOS-based level shifter 756 are disposed at a left side of the profile view 750. A second NMOS-based level shifter 760 and a second PMOS-based level shifter 758 are disposed at a right side of the profile view 750. Separating the level shifters of the respective left and right sides is an NMOS DCAP cell 752. Separating the level shifters with the NMOS DCAP cell 752 prevents undesirable conditions that result from placing the level shifters too close together, in some embodiments. Further, the DCAP cell 752 reduces the effect of noise in the integrated circuit, in some embodiments. It is noted that the particular profile view 750 depicted in FIG. 7B is only an example, and that in other examples, DCAP cells and level shifters are placed in other arrangements.

According to one embodiment, a circuit includes: one or more power rails and a tap cell structure. The tap cell structure includes one or more decoupling capacitor cells and one or more tap cells. The one or more tap cells are electrically coupled to the one or more power rails. The one or more decoupling capacitor cells are disposed adjacent to the tap cells and electrically coupled to the one or more power rails.

According to another embodiment, a tap cell structure includes: one or more tap cells disposed within a predetermined chip area; one or more decoupling capacitor cells disposed adjacent to the one or more tap cells within the predetermined chip area; and one or more connection structures configured to electrically couple the one or more decoupling capacitor cells to one or more power rails.

According to yet another embodiment, a method for manufacturing a tap cell structure includes: forming an initial tap cell structure including one or more tap cells, the initial tap cell structure corresponding to a predetermined chip area; forming one or more decoupling capacitor cells disposed adjacent to the one or more tap cells within the predetermined chip area; and forming one or more connection structures for electrically coupling the one or more decoupling capacitor cells to one or more power rails.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a first power rail;
a second power rail; and
a tap cell structure including a well tap cell, a substrate tap cell and one or more decoupling capacitor cells,
the well tap cell coupling a well region to the first power rail, the well region being a region of a first conductivity type within a substrate of a second conductivity type,
the substrate tap cell coupling the substrate of the second conductivity type to the second power rail, the substrate tap cell being electrically isolated from the well tap cell,
the one or more decoupling capacitor cells being positioned within the tap cell structure between the well tap cell and the substrate tap cell, the one or more decoupling capacitor cells including a transistor configured to act as a capacitor, the transistor comprising source and drain regions formed in the well region or the substrate, wherein the transistor source and drain regions have a different conductivity type than the well region or substrate in which they are formed.

2. The integrated circuit of claim 1, wherein the tap cell structure comprises a first tap cell structure placed adjacent to a second tap cell structure, wherein the first and second tap cell structures each include tap cells that are placed diagonally from each other.

3. The integrated circuit of claim 1, wherein the first and second tap cell structures each include decoupling capacitor cells that are placed diagonally from each other.

4. The integrated circuit of claim 1, wherein the well tap cell and the substrate tap cell include an active region and one or more connection structures, the one or more connection structures coupling the active region to the first or second power rail.

5. The integrated circuit of claim 1, wherein the one or more decoupling capacitor cells include one or more conductive materials extending to the well tap cell or the substrate tap cell.

6. The integrated circuit of claim 5, wherein:
the one or more decoupling capacitor cells include one or more transistors acting as capacitors; and
the one or more conductive materials correspond to gate terminals of the one or more transistors.

7. The integrated circuit of claim 1, wherein the one or more decoupling capacitor cells include one or more active regions configured to be biased to the first or second power rail.

8. The integrated circuit of claim 1, wherein the first and second power rails include a low-voltage power rail corresponding to an electrical ground and a high-voltage power rail.

9. The integrated circuit of claim 2, wherein the first and second tap structures each include:
a first tap cell placed along a first direction adjacent to a first decoupling capacitor cell and along a second direction adjacent to a second decoupling capacitor cell;
a second tap cell placed along the first direction adjacent to the second decoupling capacitor cell and along the second direction adjacent to the first decoupling capacitor cell;
the first tap cell placed diagonally adjacent to the second tap cell; and
the first decoupling capacitor cell placed diagonally adjacent to the second decoupling capacitor cell.

10. The integrated circuit of claim 9, wherein:
the first decoupling capacitor cell includes one or more p-type transistors acting as capacitors; and the second decoupling capacitor cell includes one or more n-type transistors acting as capacitors.

11. The integrated circuit of claim 9, wherein:
the first decoupling capacitor cell includes one or more n-type transistors acting as capacitors; and
the second decoupling capacitor cell includes one or more n-type transistors acting as capacitors.

12. The integrated circuit of claim 9, wherein:
the first decoupling capacitor cell includes one or more p-type transistors acting as capacitors; and
the second decoupling capacitor cell includes one or more p-type transistors acting as capacitors.

13. A tap cell structure comprising:
first and second tap cells disposed within a predetermined chip area;
one or more decoupling capacitor cells disposed between the first and second tap cells within one or more portions of the predetermined chip area not occupied by the one or more tap cells, the one or more decoupling capacitor cells including a transistor configured to act as a capacitor, the transistor comprising source and drain regions of a first conductivity type formed in a well or substrate of a second conductivity type that is different from the first conductivity type; and
one or more connection structures configured to electrically couple the one or more decoupling capacitor cells to one or more power rails.

14. The tap cell structure of claim 13, wherein the first and second tap cells include one or more active regions configured to be biased to the one or more power rails.

15. The tap cell structure of claim 13, wherein the one or more decoupling capacitor cells include one or more conduction materials extending to the first or second tap cell.

16. The tap cell structure of claim 15, wherein:
the one or more decoupling capacitor cells include one or more transistors acting as capacitors; and
the conduction materials correspond to gate terminals of the one or more transistors.

17. The tap cell structure of claim 13, wherein the one or more decoupling capacitor cells include one or more active regions configured to be biased to the one or more power rails.

18. The tap cell structure of claim 13, wherein the one or more power rails includes a low-voltage power rail corresponding to an electrical ground and a high-voltage power rail.

19. The tap cell structure of claim 13, wherein that tap cell structure include first and second tap cell structures, each of the first and second tap cell structures including:
a first tap cell placed along a first direction adjacent to a first decoupling capacitor cell and along a second direction adjacent to a second decoupling capacitor cell;
a second tap cell placed along the first direction adjacent to the second decoupling capacitor cell and along the second direction adjacent to the first decoupling capacitor cell;
the first tap cell placed diagonally adjacent to the second tap cell; and
the first decoupling capacitor cell placed diagonally adjacent to the second decoupling capacitor cell.

20. A method for manufacturing a tap cell structure, the method comprising:
forming an initial tap cell structure including first and second tap cells, the initial tap cell structure corresponding to a predetermined chip area;
forming one or more decoupling capacitor cells between the first and second tap cells within one or more portions of the predetermined chip area not occupied by the one or more tap cells, the one or more decoupling capacitor cells including a transistor configured to act as a capacitor, the transistor comprising source and drain regions of a first conductivity type formed in a well or substrate of a second conductivity type that is different from the first conductivity type; and
forming one or more connection structures for electrically coupling the one or more decoupling capacitor cells to one or more power rails.

* * * * *